(12) United States Patent
Cunningham

(10) Patent No.: US 7,585,766 B2
(45) Date of Patent: Sep. 8, 2009

(54) METHODS OF MANUFACTURING COPPER INTERCONNECT SYSTEMS

(76) Inventor: James A. Cunningham, 19771 Junipero Way, Saratoga, CA (US) 95070

( * ) Notice: Subject to any disclaimer, the term of this patent is extended or adjusted under 35 U.S.C. 154(b) by 0 days.

(21) Appl. No.: 12/056,163

(22) Filed: Mar. 26, 2008

(65) Prior Publication Data

US 2008/0176395 A1    Jul. 24, 2008

Related U.S. Application Data

(63) Continuation of application No. 11/278,914, filed on Apr. 6, 2006, now Pat. No. 7,372,152, which is a continuation of application No. 10/803,475, filed on Mar. 18, 2004, now Pat. No. 7,026,714.

(60) Provisional application No. 60/455,496, filed on Mar. 18, 2003.

(51) Int. Cl.
    *H01L 21/4763*    (2006.01)

(52) U.S. Cl. .................. 438/639; 438/653; 438/686; 438/687; 257/E21.584

(58) Field of Classification Search .................. 257/775
    See application file for complete search history.

(56) References Cited

U.S. PATENT DOCUMENTS

| | | | |
|---|---|---|---|
| 5,510,651 A | 4/1996 | Maniar et al. | 257/751 |
| 5,904,565 A | 5/1999 | Nguyen et al. | 438/687 |
| 5,969,422 A | 10/1999 | Ting et al. | 257/762 |
| 6,066,892 A | 5/2000 | Ding et al. | 257/752 |
| 6,169,024 B1 | 1/2001 | Hussein | 438/627 |
| 6,181,012 B1 | 1/2001 | Edelstein et al. | 257/762 |
| 6,249,055 B1 | 6/2001 | Dubin | 257/758 |
| 6,380,075 B1 | 4/2002 | Cabral, Jr. et al. | 438/637 |
| 6,403,925 B1 | 6/2002 | Johnsgard et al. | 219/390 |
| 6,461,675 B2 | 10/2002 | Paranjpe et al. | 427/250 |
| 6,469,385 B1 | 10/2002 | Avanzino et al. | 257/741 |
| 6,642,146 B1 | 11/2003 | Rozbicki et al. | 438/687 |
| 6,683,002 B1 | 1/2004 | Chooi et al. | 438/687 |
| 6,713,381 B2 | 3/2004 | Barr et al. | 257/751 |
| 6,723,635 B1 | 4/2004 | Ngo et al. | 438/627 |
| 6,767,812 B2 | 7/2004 | Abe et al. | 438/581 |
| 6,821,879 B2 | 11/2004 | Wong | 438/618 |
| 7,026,714 B2 | 4/2006 | Cunningham | 257/751 |
| 2002/0093098 A1 | 7/2002 | Barr et al. | 257/751 |
| 2002/0106895 A1 | 8/2002 | Chung | 438/687 |
| 2003/0190829 A1 | 10/2003 | Brennan | 439/200 |
| 2004/0173908 A1 | 9/2004 | Barth et al. | 257/760 |

*Primary Examiner*—Stephen W Smoot
(74) *Attorney, Agent, or Firm*—Woodcock Washburn LLP

(57) ABSTRACT

An integrated circuit (IC) may include a substrate, a first dielectric layer adjacent the substrate, and at least one trench in the first dielectric layer. The IC may also include a metal liner within the at least one trench, and a first conductive region including copper within the at least one trench. A cap layer including metal may be provided on the first conductive region. A second dielectric layer may be over the first conductive region and the cap layer. A dielectric etch stop and diffusion barrier layer may be over the second dielectric layer, and a via may be over the first conductive region and through the second dielectric layer and the cap layer. A diffusion barrier layer may be on sidewalls of the via, and an alloy seed layer including copper and at least one of tantalum, molybdenum, chromium, and tungsten may be over the diffusion barrier. The alloy seed layer may also be over the dielectric etch stop and diffusion barrier layer, and the alloy seed layer may be in contact with the first conductive region.

23 Claims, 3 Drawing Sheets

≈ 400 °C, $N_2 + O_2$

US 7,585,766 B2

METHODS OF MANUFACTURING COPPER INTERCONNECT SYSTEMS

RELATED APPLICATION

This application is a continuation of U.S. patent application Ser. No. 11/278,914 filed Apr. 6, 2006, now U.S. Pat. No. 7,372,152 which is a continuation of U.S. patent application Ser. No. 10/803,475 filed Mar. 18, 2004, now U.S. Pat. No. 7,026,714, which in turn is based upon Ser. No. 60/455,496 filed Mar. 18, 2003, the entirety of which is incorporated herein by reference.

FIELD OF THE INVENTION

The present invention relates to the field of electronics, and, more particularly, to semiconductor devices including copper interconnects and related methods. Even more particularly, the invention relates to reliability improvements for copper interconnects.

BACKGROUND OF THE INVENTION

Doped seed layers have been disclosed in the prior art, their presence directed to various objectives. These include U.S. Pat. No. 5,969,422 to Ting et al.; U.S. Pat. No. 6,249,055 to Dubin; U.S. Pat. No. 6,181,012 to Edelstein et al.; U.S. Pat. No. 6,066,892 to Ding et al.; and U.S. Pat. No. 6,461,675 to Paranjpe et al. But none of these inventions discloses a copper interconnect system where a copper via to underlying copper interconnect makes a substantially direct copper to copper connection without the presence of an intervening diffusion barrier. The presence of such a barrier tends to degrade the electromigration resistance of the system.

Two prior art patents disclose where direct or near direct copper-to-copper interfaces are formed at the base of a copper via to an underlying copper interconnect. U.S. Pat. No. 6,169,024 to Hussein forms a seed layer of varying thicknesses against a refractory metal diffusion barrier as are common in the industry, and then etches both refractory metal barrier and the dielectric cap material at the base of the via with the seed material acting as a mask. Such a process is inherently extremely difficult to control, the main problem residing in controlling the required wide variation in seed layer thicknesses.

U.S. Pat. No. 6,380,075 to Cabral, Jr. et al. discloses a process which purports a CVD method wherein the liner thickness is very thin or nonexistent at the base of the via and yet of sufficient thickness on the horizontal surfaces under the copper interconnect regions. Such a process is also inherently extremely difficult to control. Neither of these prior art references discloses use of a metal-based cap layer, alloy seed layers, or methods of improved interface bonding.

U.S. Patent Application Publication No. 2002/0106895 A1 to Chung discloses a method to provide direct copper-to-copper contact at the base of a copper dual-damascene via. But no seed layer is disclosed, and no methods for improving the adhesion at the various copper interfaces are disclosed. Upon application of high current density, any copper interface where weak bonding of the adjoined film or material is present, tends to degrade the electromigration and stress induced migration failure rates.

U.S. Patent Application Publication No. 2003/0190829 A1 to Brennan also proposes a method to provide direct copper-to-copper contact at the base of a copper dual-damascene via. But no capping or seed layers are disclosed, and no methods for improving the adhesion of the various interfaces are disclosed. The method requires use of high dielectric constant nitride-based etch stop and diffusion barriers. This tends to degrade RC delays in the copper interconnects. A more serious concern is that the patent discloses no diffusion barriers for the edges of the copper interconnects.

SUMMARY OF THE INVENTION

In view of the foregoing background, it is therefore an object of the present invention to provide a copper interconnect system which uses a conductive, metal-based cap layer, and substantially direct copper-to-copper contact at the interface of the copper via to the underlying copper interconnect. The invention, with its several embodiments, is focused on damascene type implementations. Within the dual-damascene structure, doped, that is, alloy seed layers may be used both against dielectric (insulating) and metal-based or conductive diffusion barriers. The resulting structure has improved resistance against electromigration (EM) and stress induced migration failures.

The invention provides enhanced adhesion or interfacial bonding for all critical interfaces including: seed layer to dielectric diffusion barrier layer; cap layer to main copper region; conductive trench liner barrier materials to seed layer; and conductive trench liner barrier materials to main surrounding inter-level dielectric (ILD). Use of high dielectric insulators may be minimized.

DETAILED DESCRIPTION OF THE PREFERRED EMBODIMENT

The present invention now will be described more fully with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

The following first embodiment is directed to improving the various weaknesses of prior art copper interconnect technology as discussed in detail above. These include weak bonding of the copper interconnect at the various interfaces present. Among various improvements, this invention teaches the use of certain metals and alloys to improve the bonding. This results in greatly reduced interface diffusion rates. This improves EM resistance, and reduces stress induced migration failure rates.

Figure 1:
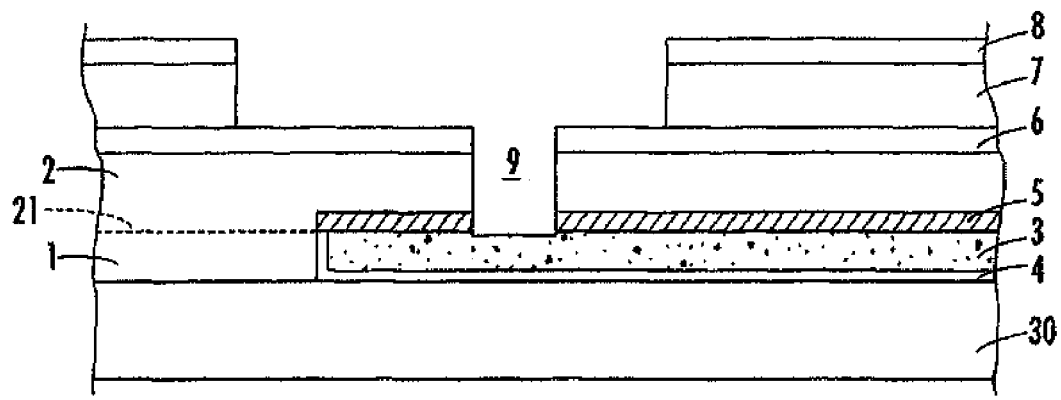
FIGS. 1-3 are schematic cross-sectional views of an integrated circuit during manufacturing thereof in accordance with a first embodiment of the present invention.

Referring to FIG. 1, a first Damascene-type interconnect comprising copper 3 is formed in an $SiO_2$ Or low-k type insulator 1 that, in turn, is on or adjacent a substrate 30. A liner 4 is formed by PVD, CVD or by (atomic layer deposition) ALD or by other methods, of Ta, Ta/TaN, Ta/TaN/Ta or other combinations thereof, or, for adhesion enhancement, an alloy or mixture comprising Ti added to Ta, Cr, Mo, W, Rh, Ru or Re—such alloys yielding improved adhesion to copper based metal 3. The barriers may also contain nitrogen or Si. In general, nitrogen tends to reduce grain boundary diffusion rates, and small concentrations of Si tend to produce amorphous or more amorphous films. The liner 4 may have a thickness in the range of one monolayer to 200 Å. The added Ti concentration would range from 1 to 30 %. Diffusion barrier liners of rhodium, ruthenium or rhenium may also be used as disclosed in U.S. Pat. No. 6,441,492, the entire contents of which are incorporated herein by reference.

Following the planarization step using CMP, as indicated by a plane shown by the dashed line 21, a selective metal-based cap 5 is then added to the surface of interconnect 3 as described above. The cap 5 may be formed using electroless Co-based alloys, such as Co—W—P or Co—W—B, or may be the Ru system described above, or another selectively deposited conductive system offering both a measure of good or improved adhesion to copper and an adequate diffusion barrier against penetration of copper into the surrounding interlevel dielectric ILD. (An alternative embodiment for a Ru-based barrier is described below.)

Dielectric layer 2 is then formed over the capped interconnect. Dielectrics used for the ILD may be $SiO_2$-based or may be one of various low-k insulators as known in the art. These include films such as: oxides containing fluoride (FSS), SiLK™, Black Diamond™, various spin-on organics, HSQ, various high-porosity $SiO_2$-based types, and many others now under investigation and refinement in the industry.

Etch stop and dielectric diffusion barriers 6 are then formed using silicon nitride, Si—C, Si—C—N—O, Si—O—N, or Si—C—N materials as are known in the art. Dielectric layer 7 and etch stop and optional diffusion barrier layer 8 are added prior to the formation of opening 9. Opening 9 is then formed using photoresist layers, not shown, as is known for the via for the first dual-damascene process. Differential etch rates for the dielectric diffusion barriers are not required in this process, so the materials may be selected for a minimum dielectric constant. The Co-based barrier system 5 is then removed over the copper 3 using argon bombardment or backsputter cleaning. For a Ru-based embodiment, the Ru metal may be removed in fluorine-based RIE plasma chemistry. For a Ru-based cap an alternative is to remove the cap material upon etching the trench for the interconnect, that is, etch the film after the via first step. Photoresist is then added and a trench for interconnect 12 is formed by plasma etching as is known in the art. Fluorine or chlorine plasma chemistries do not appreciably attack exposed copper-based metal 3.

Figure 2:
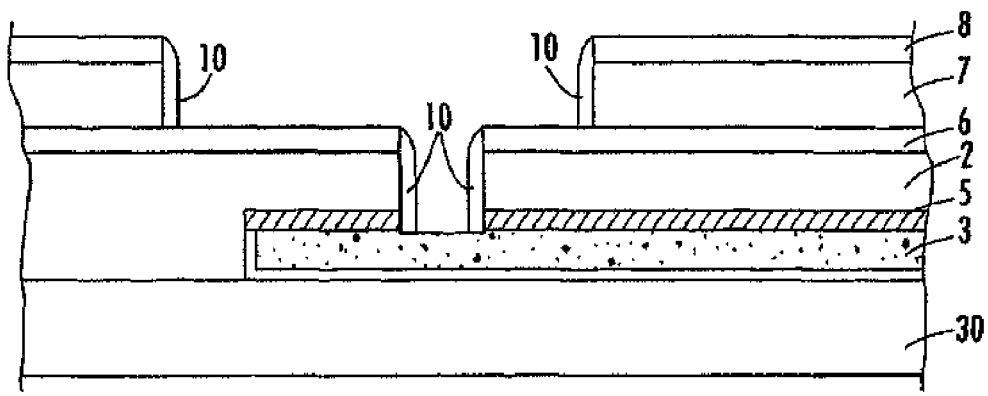

FIG. 1 shows the system at the intermediate step following opening of the trenches for a second overlying interconnect 12. FIG. 2 shows the structure following the deposition and anisotropic etchback of a conductive diffusion barrier 8 which can be of similar composition to layer 4. Alternately, the barrier may be a dielectric barrier such as silicon nitride, Si—C—N—O or Si—C—N. A diffusion barrier is deposited and is anisotropically etched back leaving edge protection layers 10 (FIG. 2). Materials, such as those used for layer 8 could be used. Selective plasma etching chemistries may be employed using chlorine or fluorine or combinations thereof as are known in the art. The copper material 3 is exposed at the base of the via. The exposed copper at this point may be cleaned and optionally passivated using displacement plating with a metal more noble than copper, such as Ag, Pd or Pt. This film thickness may be one monolayer up to about 50 Å. Following this optional plating, the surrounding dielectrics may be cleaned with chemical complexing agents. The exposed copper 3 may also be sputter cleaned prior to the formation of layer 11. The passivation step provides substantially no, or only partial, diffusion barrier properties at this copper 3 to copper 12 interface.

Figure 3:
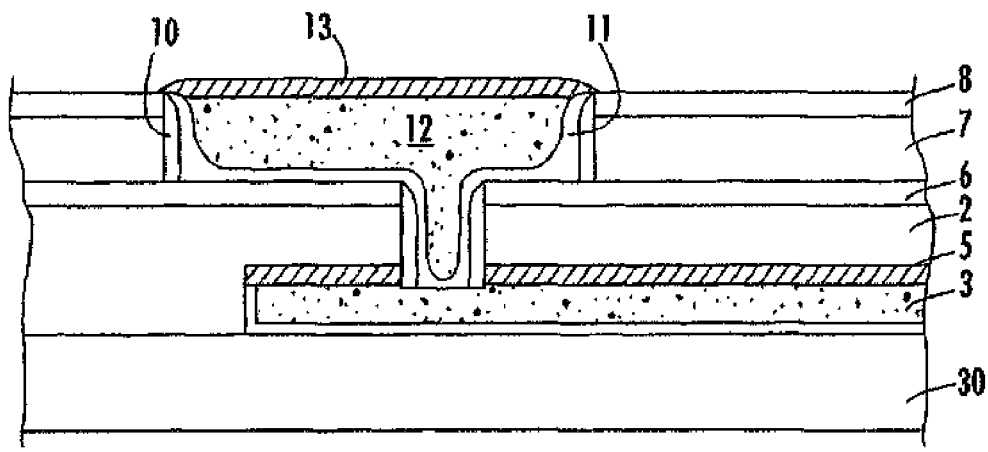

FIG. 3 shows the structure after deposition of an alloy seed layer 11. This alloy comprises copper and Ta, Cr, Mo, or W forming a mixture or alloy with improved adhesion to dielectric diffusion layer 6. The dopants Ta and Cr are preferred. The alloy seed layer 11 may be deposited by PVD, or other methods such as CVD, such that a reasonably conformal film is created. The added refractory metals may be in atomic concentrations ranging from 1 to 30% or more. Seed layer 11 is designed to be strongly copper-like and does not contain sufficient dopant or alloying material such that it behaves as a diffusion barrier. Copper metal or copper alloy 12 may be then formed by electroplating or by electroless plating as is known in the art. A cap 13 is added to the copper or copper alloy layer 12 in like manner to layer 5. The copper or copper-based metal 12 makes direct, or near direct contact, or equivalent direct contact, or contact without the intervening presence of a substantial or diffusion-blocking thickness of an immiscible or passive diffusion barrier, to copper or copper alloy metal 3. This main region copper 12 to lower level copper 3 contact is made through seed layer 11 comprising copper.

Figure 4:
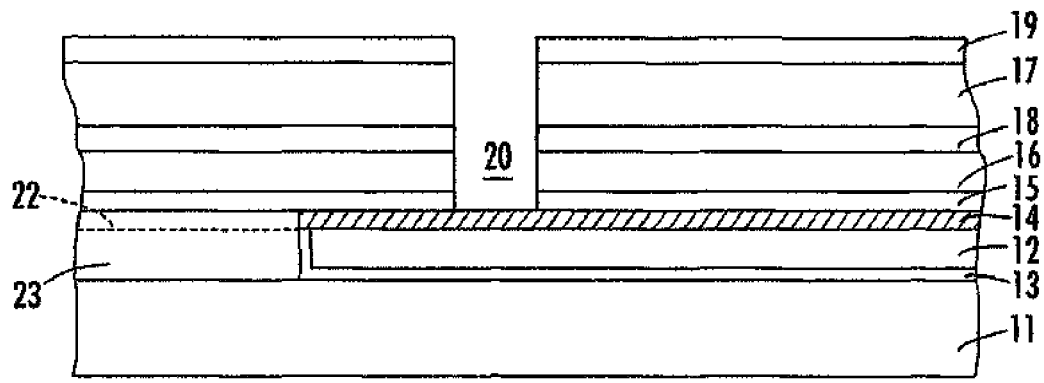
FIGS. 4-6 are schematic cross-sectional views of an integrated circuit during manufacturing thereof in accordance with a second embodiment of the present invention.
Figure 5:
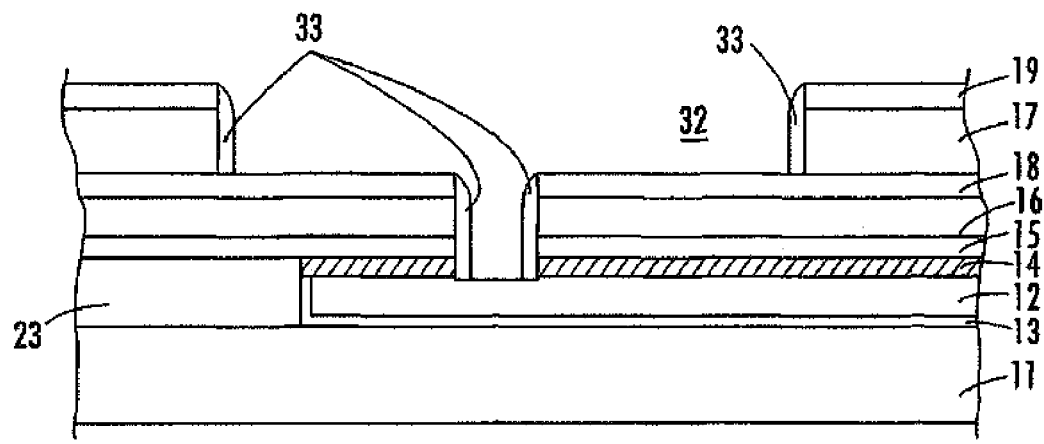
Figure 6:
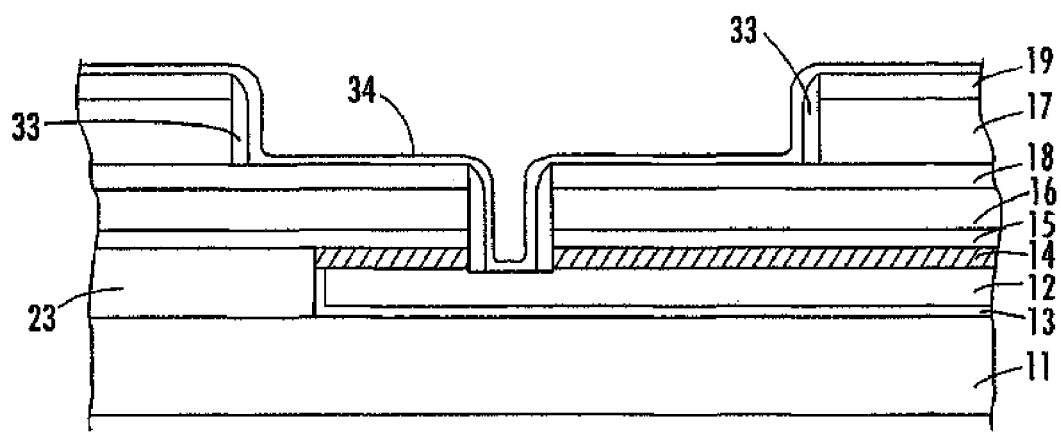

Referring now additionally to FIGS. 4-6, a second embodiment provides a conductive coating or cap layer on the copper interconnect surface for the purpose of interface diffusion rate reduction. The coating is not a robust diffusion barrier, and for that reason it is covered by a dielectric diffusion barrier. The coating is etchable in halide-containing anisotropic plasma etching chemistries (RIE), and may be removed so that overlying copper vias may make a more direct copper-to-copper connection. This aids the prevention of copper flux divergence at the base of a via, a phenomenon which tends to reduce EM resistance. This embodiment also has no substantial diffusion barrier thickness remaining at the base of copper vias.

Following FIG. 4, a copper based interconnect 12 is formed over substrate 11 by a damascene-type process. The trench is lined with diffusion barrier 13 as described in the first embodiment above. The film 23 below the dashed line 22 is an insulating layer as is known in the art, and is described in the first embodiment above. After CMP, terminating approximately along the dashed line 22 shown, the exposed copper interconnect 12 is passivated using palladium or platinum. The Pt or Pd films 14 may be selectively applied by immersion plating or by electroless plating. A film ranging in thickness from one monolayer to about 200 Å may be applied. Following the application of this metal film, the device may be annealed at 300-500° C. to interdiffuse the plated metal and copper. Both metals form continuous solid solutions with copper, and upon annealing, form a hardened surface alloy layer which retards the surface transport of copper upon elevated temperature or EM stress. Both metals are plasma etchable in halide chemistries. Alternately, the heat treatment could be performed later in the process.

Following the surface passivation step insulating films 15, 16, 17, 18, and 19 are deposited as is known in the art. Films 16 and 17 are $SiO_2$-based or may be one of various low-k insulators as known in the art. These include films listed in the first embodiment. Films 15, 18 and 19 are etch stop diffusion barrier layers, such as silicon nitride or Si—C or PECVD Si—C—N or Si—C—N—O and other "carbide" type films as are known in the art.

As shown in FIG. 4, the stack of insulating films is plasma etched, employing a photoresist layer, not shown, down to etch stop 15, as is known in the art. After applying another PR layer, not shown, which defines the trench region for a second copper based interconnect, not shown completed, the trench region 32 is etched, and film 15 and unreacted or non-interdiffused portions of passivation film 14 are removed down to the surface of material 12 comprising copper. This may be seen in FIG. 5.

Following this step, a diffusion barrier 33 is formed as described in the first embodiment in the form of an edge spacer.

An alternative embodiment is etching this barrier film, which results in edge film 33, to a non-zero thickness of 20 Å or less such that it is a partial barrier in the horizontal regions. In this case, the barrier film is electrically conducting.

Following this step, an alloy seed layer 34 is formed as described in the first embodiment. FIG. 6 shows the device following the formation of alloy seed layer 34.

It may be noted that the preferred alloying elements Ta and Cr for the alloy seed layer are carefully selected. They require two properties to perform optimally in this invention:

(1) They should be capable of forming strong M-O bonds so that good adhesion is available against the dielectric barriers such as layer 18. The Gibbs function free energy per oxygen bond for metals decreases as: Ti>Al>Ta≈Cr>Si>Mo≈W≈Co≈Re>Cu>Ru. The preferred metals also form strong M-N bonds.

(2) They should be immiscible (passive) with copper so that negligible interdiffusion occurs from the alloying elements into the main or thicker copper interconnect region formed above and onto film 34.

The main current-carrying copper region above film 34 may be unalloyed or lightly alloyed with elements which only cause small increases in resistivity such as, for example, Ag or Cd. Interdiffusion of substantial concentrations of Ta, Cr, Mo or W would cause significant increases in the resistivity in the main current-carrying copper material formed onto the alloy seed layers. If this were to happen, the system may not be viable. An exemplary alloy is Ta and copper, with the Ta concentration approximately 5 to 30 at %. A preferred alloy may be 10 to 20 at % Ta in copper. A preferred method of deposition of the seed alloy is PVD or IPVD (ionized PVD) as developed by Applied Materials and others. The sputtering parameters may be adjusted to maximize edge coverage over bottom coverage. The films may also be applied by CVD.

Finally, the bulk of the copper based interconnected is formed onto the seed layer and planarized using CMP as described in the first embodiment. The bulk copper is typically electroplated.

An alternate embodiment for the metal cap layer over copper is now disclosed. This barrier, in its more robust form, should both firmly bond to both copper and the overlying oxide insulation or dielectric, and offer passive diffusion barrier characteristics as well. An exemplary system is the following material stack: plated copper/displacement plated silver followed by displacement palladium/selective electroless plated Ru/light oxidation. This system requires no overlying dielectric diffusion barrier; thus the ILD dielectric constant is minimized.

Figure 7:
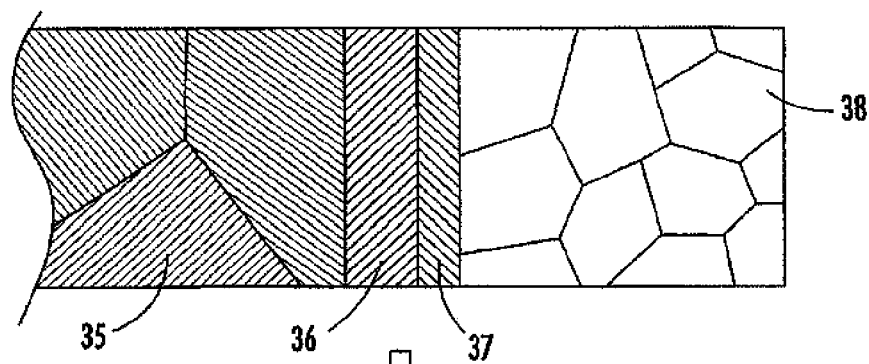
FIGS. 7 and 8 are schematic cross-sectional views of alternate embodiments of the invention.
Figure 8:
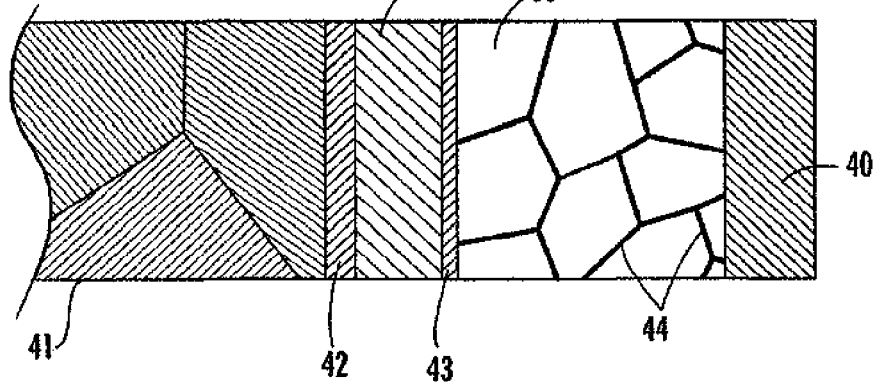

FIGS. 7 and 8 show the expected metallurgy of the system upon annealing. A copper interconnect surface such as that of copper region 3 prior to application of film 5 is represented in FIG. 7 as electroplated copper 35. Approximately 20 Å of immersion silver 36, approximately 10 Å of immersion palladium 37, and approximately 100 Å of electroless Ru 38 are applied over copper layer 35. Upon annealing, at about 400° C. in a mixture of $N_2$ and $O_2$, solid state diffusion and oxidation of the Ru occurs producing the structure of FIG. 8 represented by Cu phase 41, Cu+Pd solid solution 42, Ag+Pd solid solution 39, 1-2% Ru in $Pd_2$ phase 43, and conductive $RuO_2$ surface layer 40. Grain boundaries 44 would contain some oxidized Ru in the remaining Ru layer derived from Ru 38.

Upon application of an overlying dielectric such as film 2, the system provides a firm and strongly bound transition from copper to diffusion barrier to overlying dielectric.

Using non-cyanide complexing agents, various solutions may be prepared for immersion plating bright films of silver to copper. Silver added to copper has the smallest known effect on resistivity of all the elements. Since reduction potentials increase as Cu>Ru>Rh>Ag>Pd>Pt>Au, Pd may be immersion plated over Ag. Such an action also fills any pinholes in the Ag layer making the final film more dense.

Solutions for immersion plating of palladium are known. Ru may be electroless plated using hydrazine as a reducing agent. The final film stack may be annealed in $N_2$ followed by $N_2/O_2$ forming a conductive $RuO_2$ layer and simultaneously stuffing the grain boundaries of the Ru passive barrier.

For the embodiments where the Ru and $RuO_2$ layer were at the base of a via, the films could be removed or thinned. Since Ru forms volatile fluorides, this can be accomplished during the anisotropic plasma etching through the via ILD. This provides a more direct Cu to Cu connection from via to interconnect.

In recent years, Ru based barriers have been under investigation as diffusion and oxidation barriers for very high-k, stacked, DRAM capacitor applications.

Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that other modifications and embodiments are intended to be included within the scope of the appended claims.

What is claimed is:

1. A method of manufacturing an integrated circuit comprising:
    forming a copper based interconnect in a first dielectric layer, said first dielectric layer being adjacent to a substrate;
    adding a cap layer comprising metal to a surface of said copper based interconnect, thereby forming a capped interconnect;
    forming a second dielectric layer over said capped interconnect;
    forming a via in said second dielectric layer;
    removing a portion of said cap layer situated in said via;
    forming a diffusion barrier layer on sidewalls of said via; and
    depositing an alloy seed layer comprising copper in said via, said alloy seed layer in contact with and over said copper based interconnect.

2. A method of manufacturing an integrated circuit according to claim 1 wherein said diffusion barrier layer is conductive.

3. A method of manufacturing an integrated circuit according to claim 1 wherein said alloy seed layer further comprises at least one of tantalum, molybdenum, chromium, and tungsten.

4. A method of manufacturing an integrated circuit according to claim 1, further comprising forming at least one trench in said first dielectric layer, and forming said copper based interconnect within said at least one trench.

5. A method of manufacturing an integrated circuit according to claim 1, wherein said cap layer comprises at least one of palladium and platinum.

6. A method of manufacturing an integrated circuit according to claim 1, further comprising depositing a solid solution at the interface of said copper based interconnect and said cap layer.

7. A method of manufacturing an integrated circuit according to claim 1, further comprising forming a dielectric etch stop and diffusion barrier layer over said second dielectric layer.

8. A method of manufacturing an integrated circuit according to claim 1, further comprising forming a conductive region comprising copper over said alloy seed layer.

9. A method of manufacturing an integrated circuit comprising:
   forming a copper based interconnect in a first dielectric layer, said first dielectric layer being adjacent to a substrate;
   adding a cap layer comprising metal to a surface of said copper based interconnect, thereby forming a capped interconnect;
   forming a second dielectric layer over said capped interconnect;
   forming a via in said second dielectric layer;
   removing a portion of said metal-based cap layer situated in said via;
   forming a first diffusion barrier layer on sidewalls of said via; and
   forming a second diffusion barrier over horizontal surfaces of said via; and
   said first diffusion barrier being a different material than said second diffusion barrier.

10. A method of manufacturing an integrated circuit according to claim 9 further comprising an alloy seed layer over said first and second diffusion barriers.

11. A method of manufacturing an integrated circuit according to claim 10 wherein said alloy seed layer comprises copper and at least one of tantalum and chromium.

12. A method of manufacturing an integrated circuit according to claim 9 further comprising a dielectric diffusion barrier over said cap layer.

13. A method of manufacturing an integrated circuit according to claim 9 wherein said copper based interconnect comprises a copper interconnect.

14. A method of manufacturing an integrated circuit according to claim 9 wherein said cap layer comprises at least one of palladium and platinum.

15. A method of manufacturing an integrated circuit according to claim 9, further comprising a solid solution at the interface of said copper based interconnect and said cap layer.

16. A method of manufacturing an integrated circuit according to claim 9, further comprising a dielectric etch stop and diffusion barrier layer over said second dielectric layer.

17. A method of manufacturing an integrated circuit comprising:
   forming a copper based interconnect in a first dielectric layer, said first dielectric layer being adjacent to a substrate;
   forming a diffusion barrier and cap layer comprising a metal and a conductive oxide of said metal over said copper based interconnect, thereby forming a capped interconnect;
   forming a second dielectric layer over said diffusion barrier and cap layer.

18. A method of manufacturing an integrated circuit according to claim 17 wherein said diffusion barrier and cap layer comprises Ru and Ru oxide.

19. A method of manufacturing an integrated circuit according to claim 17 further comprising forming an alloy seed layer over said diffusion barrier and cap layer.

20. A method of manufacturing an integrated circuit according to claim 19 wherein said alloy seed layer comprises copper and at least one of tantalum and chromium.

21. A method of manufacturing an integrated circuit according to claim 19, further comprising forming a second conductive region comprising copper over said alloy seed layer.

22. A method of manufacturing an integrated circuit according to claim 17, further comprising depositing a solid solution at an interface of said copper based interconnect and said cap layer.

23. A method of manufacturing an integrated circuit according to claim 17, further comprising forming a dielectric etch stop and diffusion barrier layer over said second dielectric layer.

* * * * *